United States Patent
Pfeuffer

(10) Patent No.: US 8,086,003 B2
(45) Date of Patent: Dec. 27, 2011

(54) METHOD AND MAGNETIC RESONANCE APPARATUS TO ACQUIRE TEMPORALLY SUCCESSIVE IMAGE DATA SETS

(75) Inventor: Josef Pfeuffer, Newton, MA (US)

(73) Assignee: Siemens Aktiengesellschaft, Munich (DE)

( * ) Notice: Subject to any disclaimer, the term of this patent is extended or adjusted under 35 U.S.C. 154(b) by 739 days.

(21) Appl. No.: 12/179,694

(22) Filed: Jul. 25, 2008

(65) Prior Publication Data

US 2009/0028411 A1    Jan. 29, 2009

(30) Foreign Application Priority Data

Jul. 27, 2007  (DE) .......................... 10 2007 035 176

(51) Int. Cl.
*G06K 9/00* (2006.01)
*G01V 3/00* (2006.01)
(52) U.S. Cl. ....................................... 382/128; 324/307
(58) Field of Classification Search .......... 324/300–322; 600/410–435; 382/128–134
See application file for complete search history.

(56) References Cited

U.S. PATENT DOCUMENTS

| | | | |
|---|---|---|---|
| 6,073,041 A | 6/2000 | Hu et al. | |
| 6,472,872 B1 | 10/2002 | Jack, Jr. et al. | |
| 6,996,261 B2 | 2/2006 | deCharms | |
| 7,050,617 B2 | 5/2006 | Kiefer et al. | |
| 7,327,138 B2 * | 2/2008 | Krieg et al. | 324/307 |
| 2005/0215883 A1 | 9/2005 | Hundley et al. | |
| 2006/0033494 A1 | 2/2006 | Hennig et al. | |

FOREIGN PATENT DOCUMENTS

JP  7-59750  7/1995

OTHER PUBLICATIONS

"Retrospective Estimation and Correction of Physiological Artifacts in fMRI by Direct Extraction of Physiological Activity from MR Data," Le et al., Magnetic Resonance in Medicine, vol. 35 (1996), pp. 290-298.
"Image-based Method for Retrospective Correction of Physiological Motion Effects in fMRI: RETROICOR," Glover et al., Magnetic Resonance in Medicine, vol. 44 (2000) pp. 162-167.
"Correction of Physiologically Induced Global Off=Resonance Effects in Dynamic Echo-Planar and Spiral Functional Imaging," Pfeuffer et al., Magnetic Resonance in Medicine, vol. 47 (2002) pp. 344-353.
"Functional MR Imaging in the Awake Monkey: Effects of Motion on Dynamic Off-Resonance and Processing Strategies," Pfeuffer et al., Magnetic Resonance Imaging (2007) pp. 1-14.

* cited by examiner

*Primary Examiner* — Dixomara Vargas
(74) *Attorney, Agent, or Firm* — Schiff Hardin LLP

(57) ABSTRACT

In a method and magnetic resonance apparatus for acquisition and processing of a series of temporally successive image data sets of the series of temporally successive image data sets is acquired by magnetic resonance technology, wherein k-space image data corresponding to each image data set are acquired, and for each image data set in the series, a determination is made, in at least one first part of that image data set, of a measure that characterizes a global image intensity value of that image data set. At least one second part of the image data sets is corrected using the determined measures and/or the determined measures are used in an evaluation of at least one third part of the image data sets. A temporal change of the global image intensity value in the series of temporally successive image data sets is compensated or taken into account in this manner.

19 Claims, 4 Drawing Sheets

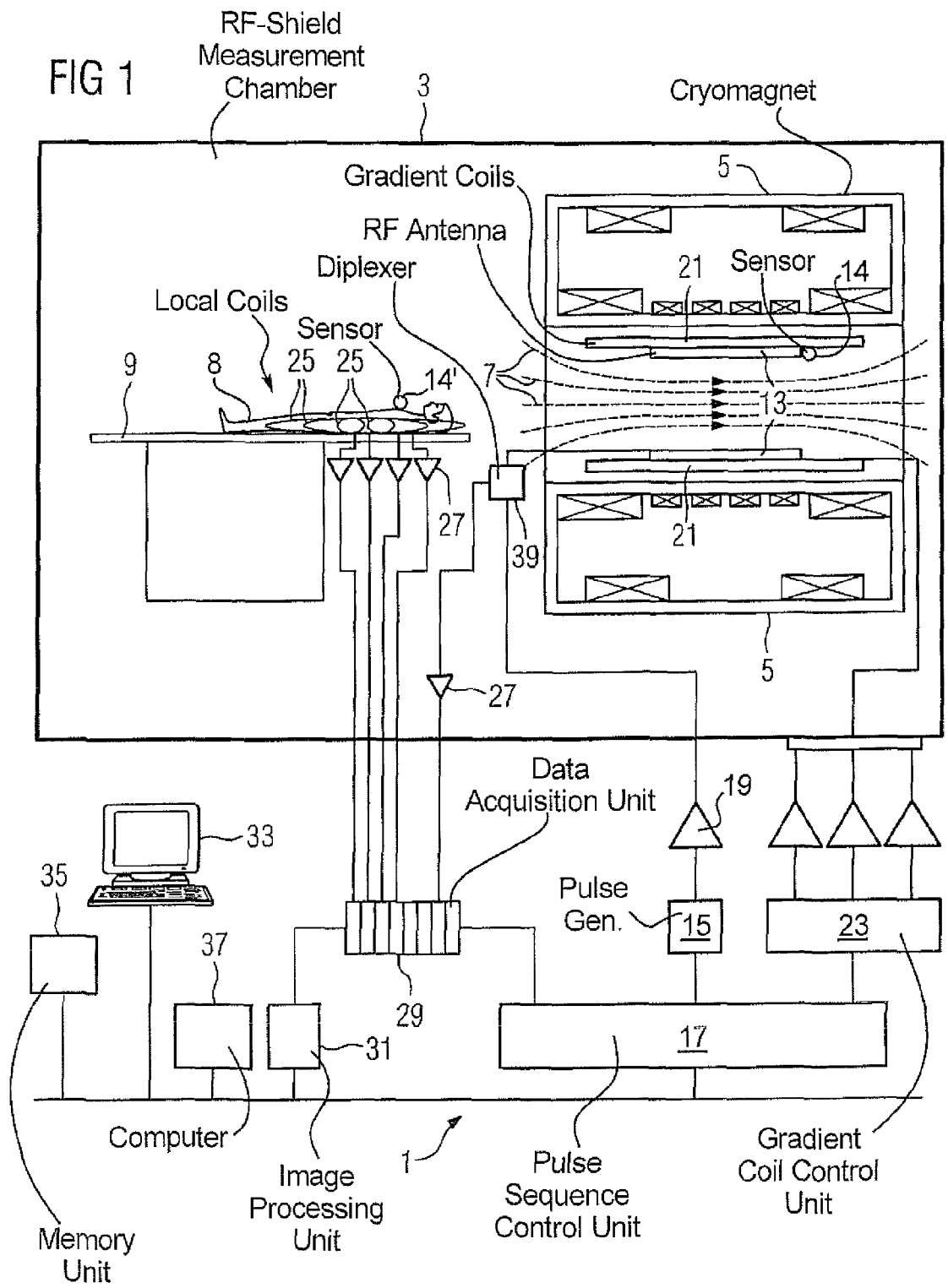

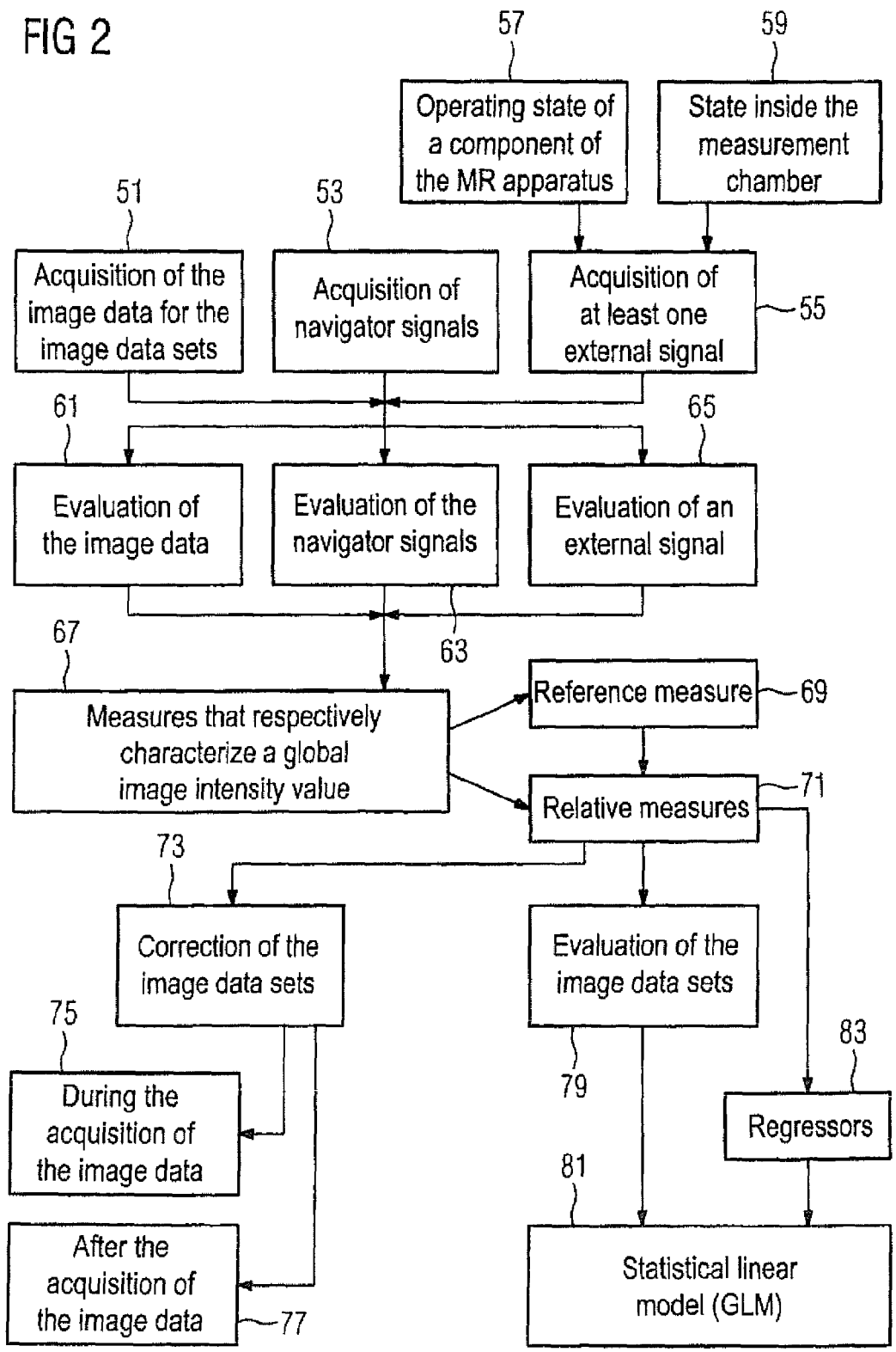

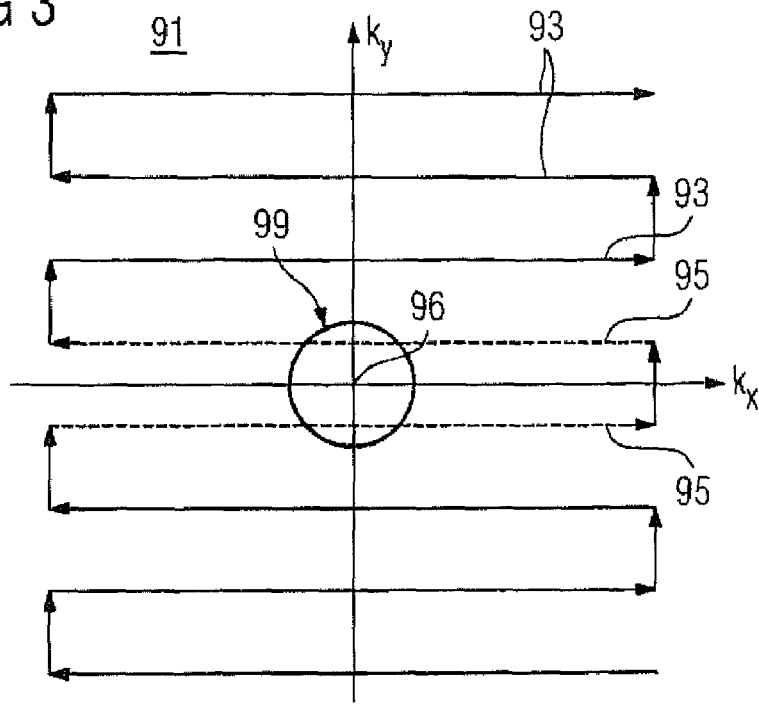
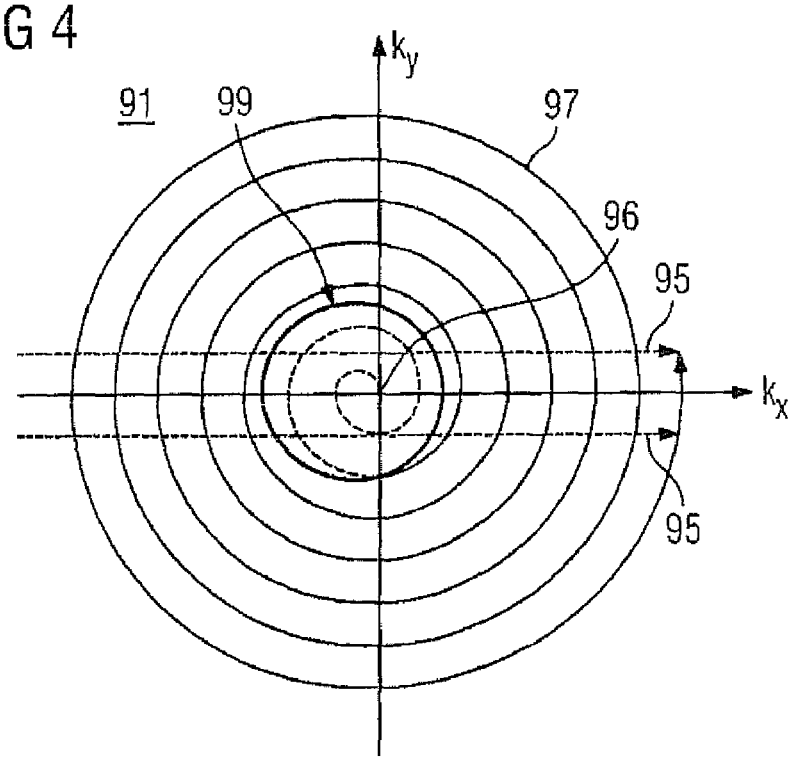

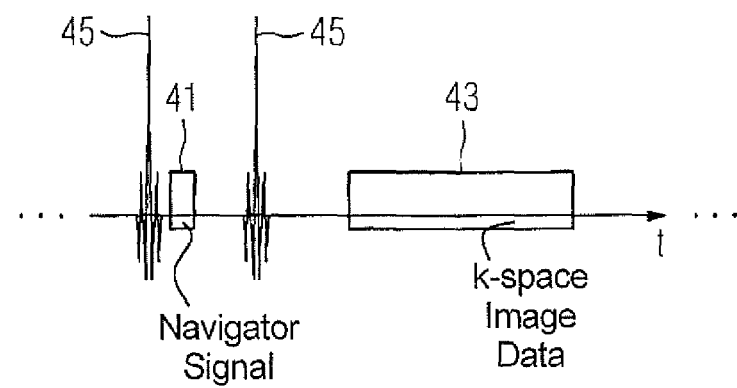
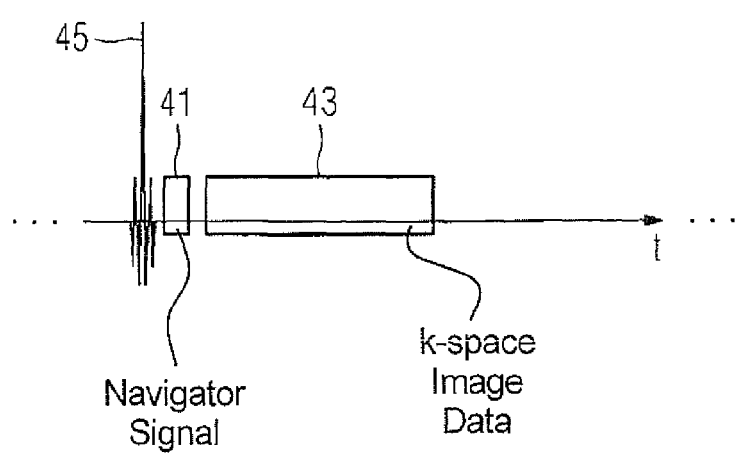

METHOD AND MAGNETIC RESONANCE APPARATUS TO ACQUIRE TEMPORALLY SUCCESSIVE IMAGE DATA SETS

BACKGROUND OF THE INVENTION

1. Field of the Invention

The present invention concerns a method for acquisition and processing of a series of temporally successive image data sets as it is used in particular in magnetic resonance technology, for example functional magnetic resonance imaging (also designated as "fMRI" in the following). Furthermore, the invention concerns a magnetic resonance apparatus for implementation of such a method.

2. Description of the Prior Art

MR technology is a technique known for some decades with which images of the inside of an examination subject can be generated. Described with significant simplification, for this the examination subject is positioned in a relatively strong, static, homogeneous basic magnetic field (field strengths of 0.2 Tesla up to seven Tesla and more) in an MR apparatus so that nuclear spins in the subject orient along the basic magnetic field. Radio-frequency excitation pulses are radiated into the examination subject to trigger nuclear magnetic resonances, the triggered nuclear magnetic resonances are measured and MR images are reconstructed based thereon. Rapidly switched magnetic gradient fields are superimposed on the basic magnetic field for spatial coding of the measurement data. The acquired measurement data are digitized and stored as complex numerical values in a k-space matrix. By means of a multi-dimensional Fourier transformation, an associated MR image can be reconstructed from the k-space matrix populated with values. The time sequence of the excitation pulses and the gradient fields for excitation of the image volume to be measured, for signal generation and for spatial coding is known as a sequence (or also as a pulse sequence or measurement sequence).

A special method of magnetic resonance imaging is known as functional magnetic resonance imaging (designated as "fMRI" in the following), which is used in particular for presentation of functional processes in the brain. In this method, image data sets of a volume to be imaged are acquired repeatedly with a fast imaging sequence in a quick time sequence, for example with a sequence known as an EPI sequence (EPI for "Echo Planar Imaging") or a sequence with spiral k-space sampling. The method thereby utilizes the different magnetic properties of oxygenated and deoxygenated blood (what is known as the BOLD effect—BOLD for "blood oxygen level dependency"). The activation of cortex areas leads to an increase of the metabolism, whereupon the activated area reacts with a disproportionate increase of the blood flow (change of the CBF for "cerebral blood flow" or, respectively, change of the CBV for "cerebral blood volume"). The concentration of oxygenated and deoxygenated hemoglobin in the activated cortex area changes, which leads to a variation of the relaxation times, for example of the $T2^*$ times.

In fMRI image series these changes are typically detected for each voxel with the aid of a statistical model. For example, a correlation analysis or an analysis with what is known as a GLM model (GLM for "general linear model") can be used here that links the measured series of image data sets with the time curve of a stimulation paradigm.

A requirement for a successful implementation of the method is an underlying stability of the image data sets, both in time and in space. This means that conditions should remain optimally stable both from image data set to image data set and from voxel to voxel within an image data set.

The spatial stability can be disrupted, for example, by a movement of the subject to be examined and be achieved with various techniques, for example with special, movement-insensitive acquisition sequences.

The temporal stability can likewise be achieved with various methods.

A method is described in the document by Hu X et al., "Retrospective estimation and correction of physiological fluctuation in functional MRI", Magnetic Resonance in Medicine 35:290-298 (1996) in which the breathing and heart cycles are monitored during the acquisition of fMRI image data and the image data are retrospectively synchronized with the physiological activity in order to estimate and remove physiological effects.

In the document by Glover G. H. et al., "Image-Based Method for Retrospective Correction of Physiological Motion Effects in fMRI: RETROICOR", Magnetic Resonance in Medicine 4:162-167 (2000), a method is disclosed with which effects of breathing and heartbeat on signal modulations in fMRI image series can be corrected. Fourier series of lower order are fitted to the image data in the time domain, based on the time difference that existed at each acquisition of image data relative to a phase of the heart cycle and breathing cycle.

A method in which global changes of the system frequency (DORK for "Dynamic Off-Resonance changes in K-space") are monitored and used for correction is disclosed in the document by Pfeuffer J. et al., "Correction of Physiologically Induced Global Off-Resonance Effects in Dynamic Echo-Planar and Spiral Functional Imaging".

This method is expanded and compared with other methods for correction of movement-induced artifacts in the document by Pfeuffer J. et al., "Functional MR imaging in the awake monkey: effects of motion on dynamic off-resonance and processing strategies", Magnetic Resonance Imaging (2007), doi: 10.1016/j.mri.2007.03.002.

SUMMARY OF THE INVENTION

An object of the present invention is to provide a method for acquisition and processing of a series of temporally successive image data sets with which a temporal stability in the series of temporally successive image data sets can be ensured in a simple manner. Furthermore, it is the object of the invention to provide a magnetic resonance apparatus to implement such a method.

The method according to the invention for acquisition and processing of a series of temporally successive image data sets includes the following steps:

acquisition of the series of temporally successive image data sets by means of magnetic resonance technology, wherein k-space image data corresponding to each image data set are acquired, for each image data set in the series, a determination is made in at least one first part of that image data set, of a measure that characterizes a global image intensity value of that image data set, correction of at least one second part of the image data sets using the determined measures and/or use of the determined measures in an evaluation of at least one third part of the image data sets.

A time change of the global image intensity value in the series of temporally successive image data sets is compensated or, respectively, taken into account in this manner.

The invention is based on the recognition that, due to various causes, the temporal stability in the series of temporally successive image data sets is not always ensured to a required extent. In order to nevertheless be able to ensure the temporal stability, a measure is determined that characterizes a global image intensity value. The measure for the global image intensity value enables fluctuations to be detected at least in part, which fluctuations conflict with the requirement for temporal stability of the image series. Such fluctuations can, for example, be what is known as a baseline drift or a jump in the global image amplitude. A correction of the series of image data sets or, respectively, an evaluation can now be implemented in an improved manner via the measure that characterizes the global image intensity value.

As used herein, "global image intensity value" means an image intensity value that is representative of the entire (thus the global) image. For example, the global image intensity value relates to the intensity value of the entire imaged volume, the entire imaged slice, or at least an essential, large part of the imaged volume or the imaged slice. In contrast to this are local variations of the image intensity values that concern only a small image region and that are based on a variation of the properties of the tissue imaged in this image region. For example, a local variation of the image intensity values occurs in activated regions in the cortex during an fMRI examination. However, a change of the global image intensity value makes the detection of the local variations more difficult since the local variation is superimposed on the change of the global image intensity value. However, with the method it is possible to at least partially compensate for the effect of a change of the global image intensity value.

The method is advantageously executed such that the determination of the measure is implemented not only in a portion of the image data sets but also in every image data set of the series of image data sets. The method is likewise advantageously implemented such that the correction is executed not only in a portion of the image data sets but rather in every image data set of the series of image data sets, and/or the determined measures are used in the evaluation not only in only a portion but in every image data set of the series of image data sets.

The acquisition of the k-space image data preferably ensues using an EPI technique or using a helical scan of k-space. The individual image data sets can be acquired in rapid succession in this manner. Such a method is particularly suitable for fMRI imaging. K-space image data are thereby measurement data with which k-space is populated and contain the information from which an image is reconstructed in a later step, for example via a multi-dimensional Fourier transformation of the k-space image data.

The measure that denotes and characterizes the global image intensity value in individual image data sets can be determined in various ways.

In one embodiment, a navigator signal is respectively acquired as well in addition to the actual k-space image data of an image data set in the acquisition of the k-space image data of the first portion of the image data sets. The determination of the measure in an image data set then ensues in that the associated navigator signal is respectively evaluated. A central k-space region is in particular scanned by the navigator signal.

The navigator signal can thereby be acquired between an excitation pulse and an acquisition of the k-space image data following this excitation pulse. This variant has the advantage that no additional excitation of nuclear spins must occur to acquire the navigator signal. Alternatively and/or additionally, an additional excitation of nuclear spins can additionally occur for the acquisition of the navigator signal. This means that separate, respective excitation pulses are radiated for the navigator signal and for the k-space image data of an image data set. The navigator signal can be both an echo signal and an FID signal (FID for "free induction decay").

The use of a navigator signal has the advantage that the navigator signal (for example in the case of a BOLD fMRI imaging) can be acquired after a relatively short delay time or short echo time, after which the contribution of the tissue contrast to the signal (for example due to the BOLD effect) is minimal. The navigator signal thus reflects the global image intensity in a good way and is only slightly influenced by local image intensity value fluctuations caused by the BOLD effect. Moreover, the navigator signal has a good signal-to-noise ratio compared with measurement data with longer echo time.

In the acquisition of the k-space image data with an EPI sequence, for example, a central k-space region can additionally be scanned in the scanning of the navigator signal before the k-space image data are acquired. In the case of a spiral scan of k-space, for example, additional central k-space points can be scanned before the beginning of a spiral, or additional k-space points can be scanned spiraling inwardly and spiraling outwardly between a scan of k-space.

In an alternative embodiment, the determination of the measure can occur by evaluating the k-space image data, that are associated with a central k-space region, in the first portion of the image data sets. This embodiment has the advantage that the acquisition of the navigator signal is not absolutely necessary in order to obtain data from a central region of k-space. However, it is disadvantageous that the data of the central k-space region possibly exhibit a reduced signal-to-noise ratio and/or an unwanted weighting (for example caused by the BOLD effect).

These two embodiments—thus the use of k-space image data of a central k-space region and the use of a navigator signal—can also be used in combination. The use of measurement data (thus of k-space image data and/or data of a navigator signal) of a central k-space region has the advantage that, due to the low spatial frequency, this k-space region reflects image properties that pertain to the global image. In the simplest case, a single central k-space point would suffice; but in order to increase the robustness and the signal-to-noise ratio, other, adjacent central k-space points can be used in order to determine the measure.

In another alternative embodiment, the measure that characterizes a global image intensity value can be determined from an external signal, i.e. from a signal that does not originate from k-space data.

This external signal can originate, for example, from a component of a magnetic resonance apparatus. Many components of a magnetic resonance apparatus can have an influence on the global image intensity, for example radio-frequency antennas with which excitation pulses are radiated. If the function of such a component is subject to a discontinuity or a drift, this can affect the global image intensity value of an image data set. A state of such a component can be externally monitored, meaning that this component is monitored via a measurement and an external signal is generated that reflects the global image intensity value in this way. Other components that can be affected by variations and lead to a change of the global image intensity value are, for example, other radio-frequency components such as, for example radio-frequency amplifiers, radio-frequency reception antennas or shim systems or components that are also responsible for the generation of magnetic fields.

The external signal can also characterize a state inside the measurement chamber. For example, such a state can be created by the subject to be examined. If a person is examined, movement of this person (for example his or her hand) can lead to the magnetic fields of the magnetic resonance apparatus changing, whereby a change of the global image intensity can result. The external signal can originate from a measurement device that monitors the state of the subject to be examined or also an additional state inside the measurement chamber.

In the event that the determined measures are used to correct at least one second portion of the image data sets of the series of image data sets, this can occur in various ways. In a simple case, the determined measures are set in relation to a reference measure. This reference measure can be, for example, the measure for the global image intensity value of the first image data set. The relative measures, i.e. the determined measures set in relation to the reference measure, can now be used in order to correct at least one portion of the image data sets of the series of image data sets. In a simple case, this can occur, for example by in that an image being generated with an image data set, which image is subsequently multiplied with the inverse relative measure. For example, such a correction can be retroactive, i.e. it can occur after acquisition of the entire series of image data sets. Given sufficiently fast computing capacity of a magnetic resonance apparatus, however, this correction can also ensue "online", i.e. during the acquisition of the k-space image data.

In the event that the determined measures are used in an evaluation of the series of image data sets, the evaluation of the image data sets can be implemented with the use of a statistical evaluation method, in particular with the use of a linear statistical model (also called GLM for "general linear model"). In this case, the determined measures or the relative measures can enter into the statistical model or into the statistical evaluation method as regressors. Although the image data sets are not directly corrected in this manner, the fluctuations of a global image intensity value are nevertheless accounted for in the evaluation. Additional regressors that enter into the statistical model or, respectively, evaluation method can be physiological signals such as, for example, a respiration signal or a heartbeat signal.

The described method and its developments are particularly suited for use in the framework of fMRI. This means that the series of temporally successive image data sets is fashioned such that metabolically-induced differences in examined tissue can be registered. Most of all, hemodynamically-dependent correlations of a neural activity in the brain or in the spinal cord of humans or animals can be examined.

The magnetic resonance apparatus according to the invention has a control unit and/or calculation unit that is/are fashioned to implement the method described above.

BRIEF DESCRIPTION OF THE DRAWINGS

FIG. 1 is a schematic overview of a magnetic resonance apparatus.

FIG. 2 is a schematic overview of the individual steps of an embodiment of the inventive method.

FIG. 3 illustrates a scanning scheme of k-space that is characteristic of an EPI sequence.

FIG. 4 illustrates a spiral k-space scanning scheme.

FIG. 5 and FIG. 6 respectively, show a section from a sequence diagram that illustrates the temporal relation of a navigator signal with an excitation pulse, and with the acquisition of the actual k-space image data.

DESCRIPTION OF THE PREFERRED EMBODIMENTS

FIG. 1 schematically shows the basic design of a magnetic resonance apparatus 1. Various magnetic fields matched to each other as precisely as possible in terms of their temporal and spatial characteristics are applied in order to examine a body by means of magnetic resonance imaging.

A strong magnet arranged in a radio frequency-shielded measurement chamber 3, typically a cryomagnet 5 with a tunnel-shaped opening, generates a strong, static basic magnetic field 7 that is typically 0.2 Tesla to three Tesla and more. A body 8 or a body part to be examined is borne on a patient bed 9 and subsequently positioned in a homogeneous region of the basic magnetic field 7.

The excitation of the nuclear spins of the body ensues via magnetic radio-frequency excitation pulses that are radiated via a radio-frequency antenna (shown here as a body coil 13). The radio-frequency excitation pulses are generated by a pulse generation unit 15 that is controlled by a pulse sequence control unit 17. After an amplification via a radio-frequency amplifier 19 they are conducted to the radio-frequency antenna. The radio-frequency system shown here is merely schematically indicated. Typically, more than one pulse generation unit 15, more than one radio-frequency amplifier 19 and multiple radio-frequency antennas are used in a magnetic resonance apparatus 1.

Furthermore, the magnetic resonance apparatus 1 has gradient coils 21 with which magnetic gradient fields for selective slice excitation and for spatial coding of the measurement signal are radiated in a measurement. The gradient coils 21 are controlled by a gradient coil control unit 23 that, just like the pulse generation unit 15, is connected with the pulse sequence control unit 17.

The signals emitted by the excited nuclear spins are received by the body coil 13 and/or by local coils 25, amplified by associated radio-frequency preamplifiers 27 and processed further and digitized by an acquisition unit 29.

Given a coil that can be operated both in transmission mode and in reception mode (such as the body coil 13, for example), the correct signal relaying is regulated by an upstream transmission-reception diplexer 39.

Sensors can be arranged on the components of the magnetic resonance apparatus 1, with which sensors a quantity can be measured from which a measure can be determined that characterizes the global image intensity value of the image in an acquired image. Shown in FIG. 1, the body coil 13 has such a sensor 14 with which the function of the body coil 13 can be monitored. For example, if the function of the body coil 13 is subject to a discontinuity and/or a drift, this change of the functionality is registered by the sensor 14. A measure can be determined from this that characterizes the global image intensity value of an image data set since the global image intensity value of an image data set is coupled with the functionality of the body coil 13.

Such a sensor is shown as an example in FIG. 1 on the body coil 13, but such sensors can be arranged on almost any component of the magnetic resonance apparatus 1, such as on gradient coils 21, on shim systems (not shown), on RF reception antennas such as the local coils 25 or even on a downstream RF processing system (radio-frequency amplifier 27 and acquisition unit 29). However, such sensors can also monitor a state inside the measurement chamber 3, in particular a state of the body 8 to be examined. For example, another sensor 14' can record a movement of the body 8 to be examined, for example the movement of the chest, such that from this a measure can be determined that correlates with a global image intensity value of the acquired image data set.

An image processing unit 31 generates from the measurement data an image that is presented to a user via an operator console or is stored in a memory unit 35. A central computer 37 controls the individual system components. The computer 37 and/or other control units (such as, for example, the pulse sequence control unit 17) of the magnetic resonance apparatus 1 are fashioned such that a method for acquisition and processing of a series of temporally successive image data sets as it is described here can be executed with the magnetic resonance apparatus 1.

FIG. 2 schematically shows an overview of the sequence of individual method steps that are or can be executed in the implementation of the method.

The acquisition of the k-space image data for the image data sets (Step 51) that are in temporal succession and thus form a series of image data sets ensues at the beginning. Such series of image data sets are acquired in fMRI imaging, for example.

The acquisition of the k-space image data can thereby ensue with known sequences such as, for example, with an echo-planar imaging sequence or with a fast sequence with a helical k-space scanning. Excitation pulses, gradient pulses and gradient fields are tuned to one another in terms of their magnitude and temporal sequence so that a respective desired contrast is achieved in the acquired image data. For example, particular known sequences that show a BOLD contrast well and therefore reflect the tissue contrast dependent on the oxygen saturation of the hemoglobin are suitable for fMRI of cortex areas. Possible sequences that are used for acquisition of k-space image data are explained in more detail further below.

The k-space image data regarding the individual image data sets are respectively acquired in temporal succession.

In addition to the acquisition of the actual k-space image data, i.e. that measurement data from which an image is reconstructed later, a navigator signal can optionally be respectively acquired (Step 53) in at least one portion of the image data sets (or in every image data set). A measure that characterizes a global image intensity value of the associated image data set can be determined in a later step with the aid of the navigator signal.

Furthermore, in addition to the acquisition of the actual k-space image data, at least one external signal can optionally be respectively acquired (Step 55) in at least a portion of the image data sets (or in all image data sets). For example, a component of the magnetic resonance apparatus or, respectively, its operating state can be monitored (Step 57) with the external signal. Alternatively, a state inside the measurement chamber can be monitored with the external signal, in particular a state that characterizes the subject to be examined (Step 59). Among these are, for example, a movement state of the subject to be examined. A measure that characterizes a global image intensity value of an image data set can be determined in the image data set in a later step with the aid of the external signal or signals by evaluating the external signal or signals that were present at the point in time of the acquisition of the k-space image data of this image data set.

After acquisition of the k-space image data and/or during the acquisition of the k-space image data, an evaluation of the respective acquired k-space image data (in particular an evaluation of those k-space image data that are associated with a central k-space region) ensues (Step 61) in at least one portion of the image data sets (advantageously in all image data sets). Alternatively and/or additionally, an evaluation ensues of the navigator signals corresponding to the image data sets (Step 63). Alternatively and/or additionally, an evaluation ensues of the external signal or signals (Step 65). The evaluation method or the evaluation methods that is applied depends on the present acquired signals and on the prevailing requirements. The more data that is evaluated, the more precisely that the method can be executed since the determined measure more precisely characterizes a global image intensity value. However, in this case the method is also more time-consuming and cost-intensive since multiple signals are evaluated and additional sensors or acquisition of external signals must possibly be provided.

In each case, the evaluation in the portion of the image data sets respectively leads to a measure that characterizes a global image intensity value of the associated image data set (Step 67). Drift and/or discontinuities in the global image intensity can now be detected in the series of temporally successive image data sets with the aid of such a measure. This can ensue in a simple manner in that the determined measures are set in relation to one another.

In a simple case, a measure for a reference measure is ascertained from the determined measures, and the other measures are set in relation to this reference measure (Step 69), for example by taking a quotient with the reference measure. For example, the determined measure in the first image data set can be used as a reference measure. Relative measures are generated from the determined measures in this manner (Step 71).

In an embodiment of the method, the determined measures can be used to correct the series of temporally successive image data sets (or at least a portion of the image data sets) (Step 73).

For example, a correction of the image data sets can ensue in a simple manner with the relative measures. In an image data set, a division of the image amplitudes by the associated relative measure can be implemented, for example. In this manner the image data sets are approximated to one another so that fluctuations in the global image intensity value are compensated. Depending on the design of the method, such a correction of the image data sets can ensue during the acquisition of the k-space image data (Step 75) and/or after an occurred acquisition of the k-space image data (Step 77).

In the event that the measures or the relative measures are determined during the acquisition of the k-space image data, these measures can be displayed to a user who can thus monitor the quality of the acquisition of the measurement data. As an alternative, the measures can be automatically evaluated at least in part (for example via a software), and the quality of the acquisition of the measurement data can thus be monitored.

In the event that an external signal is acquired that characterizes an operating state of an MR component, this signal can also be used as an input for a monitoring software. In the event that an external signal is acquired that characterizes a state of a subject to be examined (for example a movement state of a patient), the measurement can be repeated if necessary with more precise instruction for the patient.

Alternatively or additionally, in another embodiment of the method the determined measures can be used in an evaluation of the series of temporally successive image data sets (or at least of a portion of the image data sets) (Step 79). Given an fMRI examination, an evaluation of the series of image data sets typically ensues using a statistical evaluation method (Step 81), for example using a statistical linear model (also known as a GLM). If such an evaluation ensues, the measure or, the relative measures can be inserted as regressors into the statistical linear model so that a fluctuation in the global image intensity value in the course of the series of image data sets is taken into account and compensated in the evaluation of the image data sets (Step 83).

FIG. 3 shows a scanning scheme of k-space 91 as used in an EPI sequence for scanning of k-space 91, for example. The scanning scheme of k-space shown in FIG. 3 is merely schematically drawn and serves only for the explanation of the underlying idea. Scale ratios are not correctly rendered in FIG. 3.

After an excitation pulse, the generation of a plurality of successive gradient echoes with which a plurality of k-space lines 93 are scanned after the excitation pulse ensues in an EPI sequence via correspondingly switched gradient fields. Drawn in dashes in FIG. 3 are two central k-space lines 95 that are exemplary for a central k-space region 99. A measure that characterizes the global image intensity value of the associated image data set can be determined in a simple manner using the k-space image data of the central k-space region 99 or using an additionally-acquired navigator signal with which this central k-space region 99 is scanned. This is based on the fact that only k-space image data with low spatial frequency are reproduced in the central k-space region 99. These k-space image data correspond to global image data, i.e. image data that characterize the entire image data set, in contrast to local image data that possess a high spatial frequency and that therefore are reproduced in peripheral k-space regions.

The navigator signal can scan only a small region. In the simplest case, a determination of the global image intensity value can be determined using just k-space data of the navigator signal that populate the k-space center 96. Surrounding k-space data of the central k-space region 99 can also be used to improve the robustness of the method and to increase the signal-to-noise ratio. The same analogously applies for the case that k-space image data are used to determine the global image intensity value. Here as well, in a simple case just the k-space image data of the k-space center 96 can be used, or also surrounding k-space image data of the central k-space region 99.

For example, the signal strength of the k-space image data of the central k-space region or, respectively, the signal strength of the associated navigator signal (i.e. the magnitude of the amplitude of the k-space image data of the central k-space region or the amplitude of the navigator signal) can be used as a measure for the global image intensity value of an image data set.

FIG. 4 shows an additional scanning scheme as it can be used in fMRI imaging. The scanning scheme of k-space shown in FIG. 4 is only schematically drawn and serves merely to explain the underlying idea. Scale ratios in FIG. 4 are not correctly rendered.

K-space 91 is scanned using spiral scan. This is enabled by gradient fields that are sinusoidally modulated with varying amplitude and frequency in a known manner in two directions orthogonal to one another after an excitation pulse.

The spiral 97 is shown with a dashed line in the central k-space region 99. These k-space image data can be used to determine a measure that characterizes the global image intensity value of the associated image data set. Alternatively and/or additionally, a more central k-space region 99 can be scanned using a navigator signal (represented by two central k-space lines 95).

FIG. 5 schematically shows a section from a sequence diagram. Both a navigator signal 41 and actual k-space image data 43 are acquired in an image data set in the associated sequence. The navigator signal and the actual k-space image data are thereby respectively acquired after a separate excitation pulse 45. The navigator signal can be acquired directly as an FID signal according to the associated excitation pulse or as an echo signal in the further course.

Additional, possibly present excitation pulses or inversion pulses as well as gradient fields are not shown since they are not necessary to explain the concept shown in FIG. 5 and FIG. 6.

In contrast to FIG. 5, FIG. 6 shows a section from a sequence diagram in whose associated sequence the navigator signal 41 and the actual k-space image data 43 are acquired after the same excitation pulse 45. The navigator signal 41 is acquired between the excitation pulse 45 and the k-space image data 43 acquired thereupon.

In both cases, the k-space image data 43 and the navigator signal 41 are acquired at different potentials after an excitation pulse 45. This has the advantage that the navigator signal 41 and the k-space image data 43 exhibit a different contrast. The navigator signal 41 and the k-space image data 43 can be matched to one another such that a desired tissue contrast whose change in the time curve of the series of image data sets should be examined is predominantly reflected in the k-space image data 43 while the navigator signal 41 does not exhibit this contrast response.

The measure for a global image intensity value can be determined from the navigator signal 41 in a particularly robust manner in this way since the navigator signal 41 remains largely unaffected by the changing tissue contrast.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for acquiring and processing a series of temporally successive image data sets, comprising the steps of:
   acquiring a series of temporally successive magnetic resonance image data sets using a magnetic resonance data acquisition system, with corresponding k-space image data also being acquired for each of said magnetic resonance image data sets;
   for each of respective magnetic resonance image data sets in a first portion of the magnetic resonance image data sets in said series, automatically electronically determining a measure that characterizes a global intensity value of the respective magnetic resonance image data set; and
   automatically electronically correcting respective magnetic resonance data sets in a second portion of the image data sets in said series using the respective measures to compensate for a temporal change of the respective global image intensity values for the magnetic resonance image data sets in said series, or using the respective measures to automatically electronically evaluate a third portion of the magnetic resonance image data sets in said series dependent on a temporal change of the respective global image intensity values for the magnetic resonance image data sets in said series.

2. A method as claimed in claim 1, comprising:
   if the respective magnetic resonance image data sets in said second portion of said magnetic resonance image data sets in said series are corrected, correcting the respective magnetic resonance image data sets in said second portion of said magnetic resonance image data sets in said series by making said second portion correspond to said first portion; and
   if said measures are used to evaluate said third portion of the magnetic resonance image data sets in said series, making said third portion correspond to said first portion.

3. A method as claimed in claim 2 comprising employing, as said first portion of the magnetic resonance image data sets in said series, all of said magnetic resonance image data sets in said series.

4. A method as claimed in claim 1 comprising acquiring said k-space image data using a technique selected from the group consisting of echo planar imaging and helical scanning of k-space.

5. A method as claimed in claim 1 comprising acquiring a navigator signal in addition to said k-space image data in the acquisition of the k-space image data for said first portion of said magnetic resonance image data sets in said series, and determining said measure by automatically electronically evaluating said navigator signal.

6. A method as claimed in claim 5 comprising scanning a central region of the k-space image data in k-space, using the navigator signal, for each of said k-space image data sets.

7. A method as claimed in claim 5 comprising acquiring said navigator signal between an excitation pulse and acquisition of the k-space image data following said excitation pulse.

8. A method as claimed in claim 5 comprising generating at least two different excitation pulses and respectively acquiring said navigator signal and said k-space image data after said different excitation pulses.

9. A method as claimed in claim 1 comprising automatically electronically determining said measure by evaluating k-space image data in a central region of k-space for the magnetic resonance image data sets in said first portion of magnetic resonance image data sets in said series.

10. A method as claimed in claim 1 comprising acquiring at least one external signal in addition to the k-space image data for the magnetic resonance image data sets in said first portion of magnetic resonance image data sets in said series, said signal characterizing an operating state of a component of said magnetic resonance apparatus or a state of an examination subject in the measurement chamber of the magnetic resonance apparatus.

11. A method as claimed in claim 1 comprising, if the respective magnetic resonance image data sets in the second portion of magnetic resonance image data sets in said series are corrected, setting the respective measures relative to a reference measure and correcting the respective magnetic resonance image data sets in said second portion with respect to said reference measure.

12. A method as claimed in claim 1 comprising, if the respective magnetic resonance image data sets in said second portion of said magnetic resonance image data sets in said series are corrected, correcting the respective magnetic resonance image data sets in said second portion of said magnetic resonance image data sets in said series during acquisition of the k-space image data.

13. A method as claimed in claim 1 comprising, if the respective magnetic resonance image data sets in said second portion of said magnetic resonance image data sets in said series are corrected, correcting the respective magnetic resonance image data sets in said second portion of said magnetic resonance image data sets in said series after completion of acquisition of the k-space image data.

14. A method as claimed in claim 1 comprising, if the respective magnetic resonance image data sets in said third portion of said magnetic resonance image data sets in said series are evaluated, automatically electronically evaluating the respective magnetic resonance data sets in said third portion of magnetic resonance data sets in said series using a statistical evaluation technique.

15. A method as claimed in claim 14 comprising using a linear statistical model in said statistical evaluation technique.

16. A method as claimed in claim 14 comprising using said measures as regressors in said statistical evaluation technique.

17. A method as claimed in claim 1 comprising acquiring said temporally successive magnetic resonance image data sets in said series using a functional magnetic resonance imaging data acquisition sequence.

18. A magnetic resonance apparatus comprising:
   a magnetic resonance data acquisition unit configured to receive an examination subject therein to acquire a series of temporally successive magnetic resonance image data sets from the subject, with corresponding k-space image data being acquired for each magnetic resonance data set in said series; and
   a processor configured to automatically determined, for each of respective magnetic resonance image data sets in a first portion of the image data sets in said series, a measure that characterizes a global intensity value of the respective magnetic resonance image data sets, and to automatically correct respective magnetic resonance data sets in a second portion of the image data sets in said series by using the respective measures to compensate for a temporal change of the respective global image intensity values for the magnetic resonance image data sets in said series, or using the respective measures to automatically evaluate at least a third portion of the magnetic resonance image data sets in said series dependent on a temporal change of the respective global image intensity values for the magnetic resonance image data sets in said series.

19. A magnetic resonance apparatus as claimed in claim 18 wherein said magnetic resonance data acquisition unit acquires said series of temporally successive magnetic resonance image data sets using a functional magnetic resonance imaging data acquisition sequence.

* * * * *